United States Patent

Thornton

[11] Patent Number: 6,020,839
[45] Date of Patent: Feb. 1, 2000

[54] ANALOG TECHNIQUE TO DETECT ASYMMETRIC RADIO FREQUENCY PULSES

[75] Inventor: Barry Thornton, Austin, Tex.

[73] Assignee: INT Labs, Inc., Austin, Tex.

[21] Appl. No.: 08/958,017

[22] Filed: Oct. 27, 1997

[51] Int. Cl.[7] ................................................... H03M 1/12
[52] U.S. Cl. ........................................... 341/155; 341/157
[58] Field of Search .................................. 341/155, 157; 375/260, 316, 340

[56] References Cited

U.S. PATENT DOCUMENTS

| | | | |
|---|---|---|---|
| 3,566,036 | 2/1971 | Roche et al. | 179/15 |
| 4,647,968 | 3/1987 | Willis | 358/141 |
| 4,980,687 | 12/1990 | Newell et al. | 341/157 |
| 5,042,052 | 8/1991 | Roberts et al. | 375/97 |
| 5,175,749 | 12/1992 | Ficht et al. | 375/76 |
| 5,387,913 | 2/1995 | Park et al. | 341/155 |
| 5,392,044 | 2/1995 | Kotzin et al. | 341/155 |
| 5,444,560 | 8/1995 | Barnsley | 359/138 |
| 5,457,559 | 10/1995 | Saito et al. | 359/135 |
| 5,469,112 | 11/1995 | Lee | 329/302 |

*Primary Examiner*—Michael Tokar
*Assistant Examiner*—Anh Tran
*Attorney, Agent, or Firm*—Haynes and Boone, L.L.P.

[57] ABSTRACT

Method and apparatus for processing an analog signal comprising one or more digital data streams encoded as a series of pulses is described. In a preferred embodiment, the analog signal is input to a mixer for mixing the signal with a signal of a local oscillator frequency to increase the frequency of the analog signal. The signal output from the mixer is applied to a narrow band filter such that a series of pulses is output from the filter when a signal of the frequency to which the filter is tuned is applied to the filter. The pulses are detected by a wave shaper, which uses them to identify the presence of a bit transition in the encoded data stream represented by the series of pulses. The wave shaper determines the polarity of the pulse, that is, whether it is positive or negative, which indicates whether the corresponding transition of the encoded data stream is positive or negative, respectively, then uses this information to reconstruct each digital bit, and hence the entire data stream. In an alternative embodiment, a plurality of filter/wave shaper pairs are used to recover multiple digital data streams from the analog signal.

17 Claims, 2 Drawing Sheets

ANALOG TECHNIQUE TO DETECT ASYMMETRIC RADIO FREQUENCY PULSES

CROSS-REFERENCE TO RELATED APPLICATION

This application claims the benefit of U.S. Provisional Patent Application Serial No. 60/030,592, filed on Nov. 13, 1996, and is related to U.S. patent application Ser. No. 08/958,184 filed on even date herewith, both of which are hereby incorporated by reference in their entireties.

TECHNICAL FIELD

The invention relates generally to digital data communication and, more particularly, to system and method for analog domain detection and extraction of information encoded in a series of asymmetric signal pulses.

BACKGROUND OF THE INVENTION

There are at least two known techniques for achieving the transmission of multiple data streams in a single medium. The first is "time domain multiplexing", or "TDM", in which each of the multiple individual data streams to be combined is sampled and assigned a specific timed space in a new data stream. This new data stream must also include some form of synchronization information that serves to identify the beginning of the data packages. The process is reversed at the receiving end to recover the data. TDM is illustrated in FIG. 1.

Typically, the data sampling rate is eight to ten times that of the highest speed data stream to be sampled to reduce the jitter or time errors incurred during the sampling process. The addition of overhead for the synchronization information runs the bandwidth of the new data stream to a much higher rate than any of the individual data streams.

The second technique is a process in which each individual data stream to be combined is used to modulate an individual carrier. The modulated carriers are then transmitted in a manner similar to that used by individual radio stations in making transmissions. As illustrated in FIG. 2, this technique requires that the total bandwidth be sufficiently wide to accommodate the sum of the carriers and their respective data-bearing sidebands. As with TDM, the process is reversed at the receiving end to recover the data.

It is apparent that the primary disadvantage of both of the techniques described above is the large bandwidth needed to transmit the signals. With the first technique, the bandwidth requirement is due to the data sampling process itself and the overhead required for synchronization in the demultiplexing process. With the second technique, the bandwidth requirement is due to the spectrum spread needed for the individual carriers and their respective sidebands.

Therefore, what is needed is a technique for detecting and recreating multiple digital data streams from a stream of asymmetric signal pulses.

SUMMARY OF THE INVENTION

In a preferred embodiment, the invention comprises method and apparatus for decoding an encoded analog signal received via a transmission medium, which may be either a wired or wireless medium. The encoded analog signal comprises one or more multiple digital data streams encoded and combined using the system and method described in detail in U.S. patent application Ser. No. 08/958,184.

In one embodiment, the encoded analog signal is input to a mixer for mixing the signal with a signal of a local oscillator frequency to increase the frequency of the encoded analog signal. The signal output from the mixer is applied to a narrow band filter such that a series of pulses is output from the filter when a signal of the frequency to which the filter is tuned is applied to the filter.

These pulses are detected by a wave shaper, which uses them to identify the presence of a bit transition in the encoded data stream represented by the series of pulses. The wave shaper determines the polarity of the pulse, that is, whether it is positive or negative, which indicates whether the corresponding transition of the encoded data stream is positive or negative, respectively, then uses this information to reconstruct each digital bit, and hence the entire data stream. In this embodiment, as the filter is fixedly tuned to a single frequency, the "tuning" is accomplished by changing the frequency of the local oscillator.

In an alternative embodiment, a plurality of filters and wave shapers are used to enable the simultaneous recovery of multiple digital data streams. As previously indicated, the encoded analog signal transmitted via the transmission medium may include several encoded data streams each encoded using a different length, and hence a different frequency, pulse to represent transitions in the data stream. Accordingly, in this embodiment illustrated, each of the filters is tuned to a different frequency, and hence the output thereof will be a series of pulses representing a different data stream. As with the embodiment first described, the output of each filter is input to a corresponding wave shaper, which reconstructs the data stream as described above.

A technical advantage achieved with the invention is that the recovery of digital data is performed in the analog domain, thereby exploiting the bipolar characteristics of analog signals.

Another technical advantage achieved with the invention is that the it enables digital bits to be recovered and recreated from edge encoded information only.

Yet another technical advantage achieved with the invention is that it directly converts pulse duration information into a "tunable" characteristic.

Yet another technical advantage achieved with the invention is that it enables information to be encoded and transmitted in a smaller frequency bandwidth.

DETAILED DESCRIPTION OF THE PREFERRED EMBODIMENT

Figure 1:
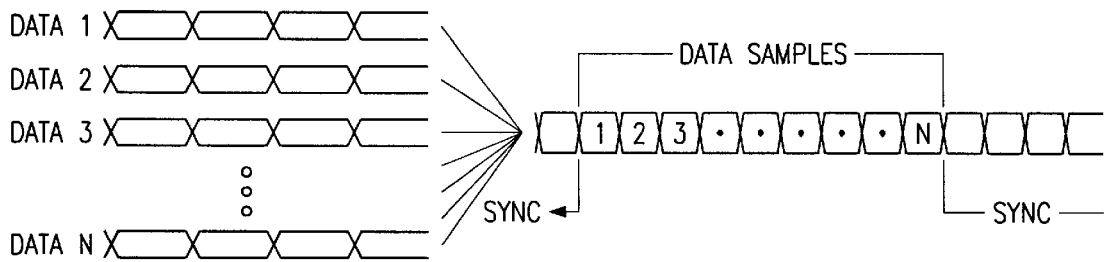
FIGS. 1 and 2 respectively illustrate prior art techniques for transmitting multiple data streams via a single medium.
Figure 2:
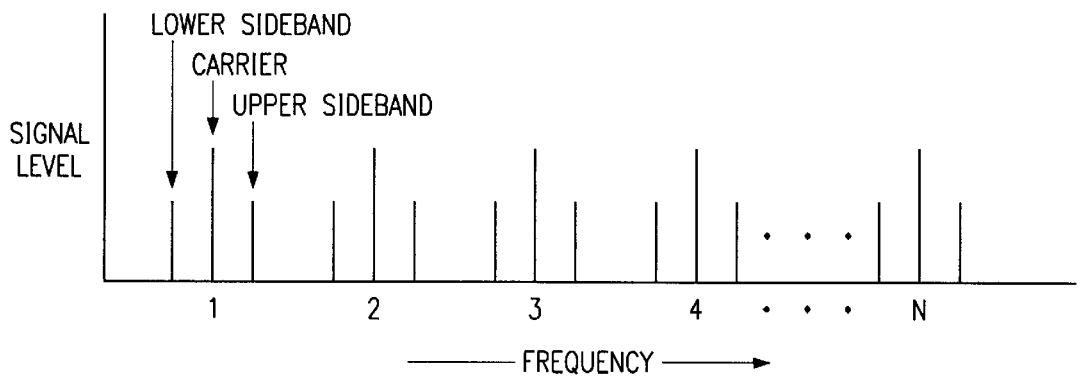

FIGS. 1 and 2 illustrate prior art techniques for achieving transmission of multiple data streams via a single medium.

Figure 3:
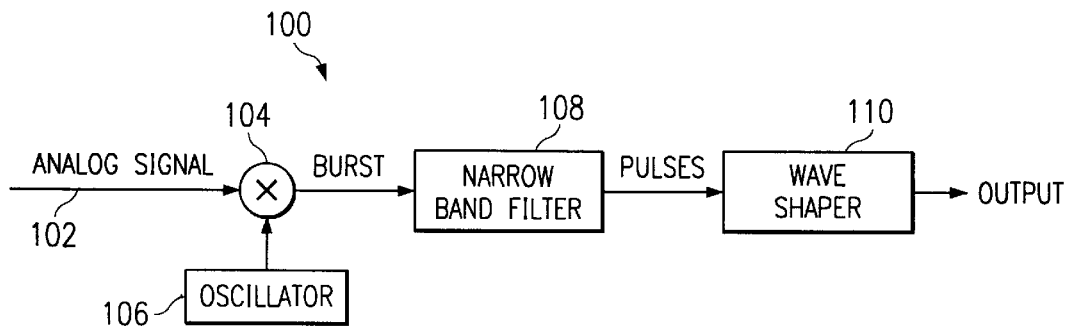
FIG. 3 is a block diagram of a decoder embodying features of the present invention.

FIG. 3 is a system block diagram of a decoder 100 embodying features of the present invention for decoding an encoded analog signal received via a transmission medium 102, which may be either a wired or wireless medium. The encoded analog signal input to the decoder 100 comprises one or more multiple digital data streams encoded and combined using the system and method described in detail in U.S. patent application Ser. No. 08/958,184.

In general, as described in Ser. No. 08/958,184, for each of the one or more digital data streams to be transmitted, a pulse of an assigned length corresponding to a particular frequency is generated each time the data stream makes a transition. The polarity of the pulse represents the direction of the corresponding transition, i.e., a positive pulse represents a zero to one transition, or a "rising edge," and a negative pulse represents a one to zero transition, or a "falling edge." Because a different length pulse is assigned to each data stream to be encoded such that each incoming data stream will generate pulses of different length, each encoded data stream will occupy a different part of the frequency spectrum. These different pulse lengths create a group of "channels" each representing the activities of the corresponding data stream. In each case, the length of the data pulse is shorter than the length of the fastest individual bit to be processed. The pulses are then summed in an analog summer and transmitted as the encoded analog signal via a transmission medium 102.

As shown in FIG. 3, in the preferred embodiment, the encoded analog signal is input to a mixer 104, which mixes the analog signal with a signal of a local oscillator frequency 106, e.g., 1 GHz, to increase the frequency of the encoded analog signal such that each pulse of the original signal now comprises a plurality of pulses. In the preferred embodiment, the mixer 104 is a balanced modulator, but could be any other device capable of combining signals of differing frequencies as described above. It should be noted that, although from an efficiency standpoint, it is preferable to include the mixer 104/oscillator 106 in the decoder 100, from an operational standpoint, it is not necessary to do so.

As previously indicated, due to the nature of the encoding technique, the encoded analog signal input to the decoder 100 may be regarded as comprising one or more series of pulses representing one or more encoded data signals, respectively. As each pulse of the encoded analog signal is actually just a short section of a waveform somewhat similar to a sine or cosine squared continuous signal, its energy is a short burst of several frequencies the sum of which is the pulse itself. These different frequencies beat against the local oscillator frequency 106, which is considerably higher, to produce a burst of high frequency radio energy that is output from the mixer 104 The envelope of the data burst output from the mixer will be the image of the pulse input thereto. The frequency of the burst will be the product of the fundamental frequency represented by the data burst and the local oscillator. Assuming these signals are sinusoidal in nature, the process can be expressed by the following equation:

$$A \sin (w_A t) * B \sin (w_B t) = AB/2 [\cos ((w_A - w_t)) - \cos ((w_A + w_B t)]$$

Accordingly, if the data burst output from the mixer 104 is applied to a very narrow band filter 108, which may be, for example, a SAW or the like, the duration of the burst is long enough to accommodate the transient excitation delay of the filter 108 to get a series of pulses out of the filter when a signal of the frequency to which the filter is tuned is applied to the filter.

These pulses are detected by a wave shaper 110 and identify the presence of a bit transition in the encoded data stream represented by the series of pulses. The wave shaper 110 determines the polarity of the pulse, that is, whether it is positive or negative, which indicates whether the corresponding transition of the encoded data stream is positive or negative, respectively, then uses this information to reconstruct each digital bit, and hence the entire data stream. In the embodiment illustrated in FIG. 1, where the filter 108 is fixedly tuned to a single frequency, the "tuning" is accomplished by changing the frequency of the local oscillator 106.

Figure 4:
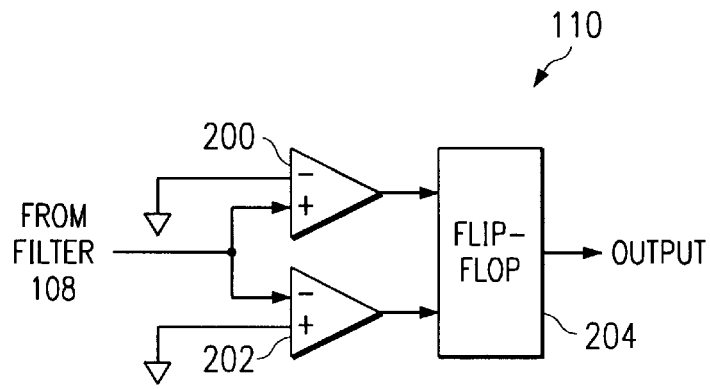
FIG. 4 is a block diagram of an exemplary embodiment of a wave shaper of the decoder of FIG. 3.

FIG. 4 illustrates one embodiment of the wave shaper 110 (FIG. 3). As shown in FIG. 2, the wave shaper 110 comprises two comparators 200, 202, the respective outputs of which are each connected to an input of a flip-flop 204. In operation, the output of the filter 108 is input to the positive input of the comparator 200, the negative input of which is tied to ground, and to the negative input of the comparator 202, the positive input of which is tied to ground. Accordingly, when a positive pulse, corresponding to a zero to one transition in data, is output from the filter 108, the comparator 200 triggers and the output of the flip-flop 204 goes high and remains high until the other comparator 202 triggers. Similarly, when a negative pulse, corresponding to a negative transition in data, is output from the filter 108, the comparator 202 triggers and the output of the flip-flop 204 goes low and remains low until the comparator 200 is once again triggered. It will be recognized by those skilled in the art that alternative embodiments of the wave shaper 110 may be implemented as well.

Figure 5:
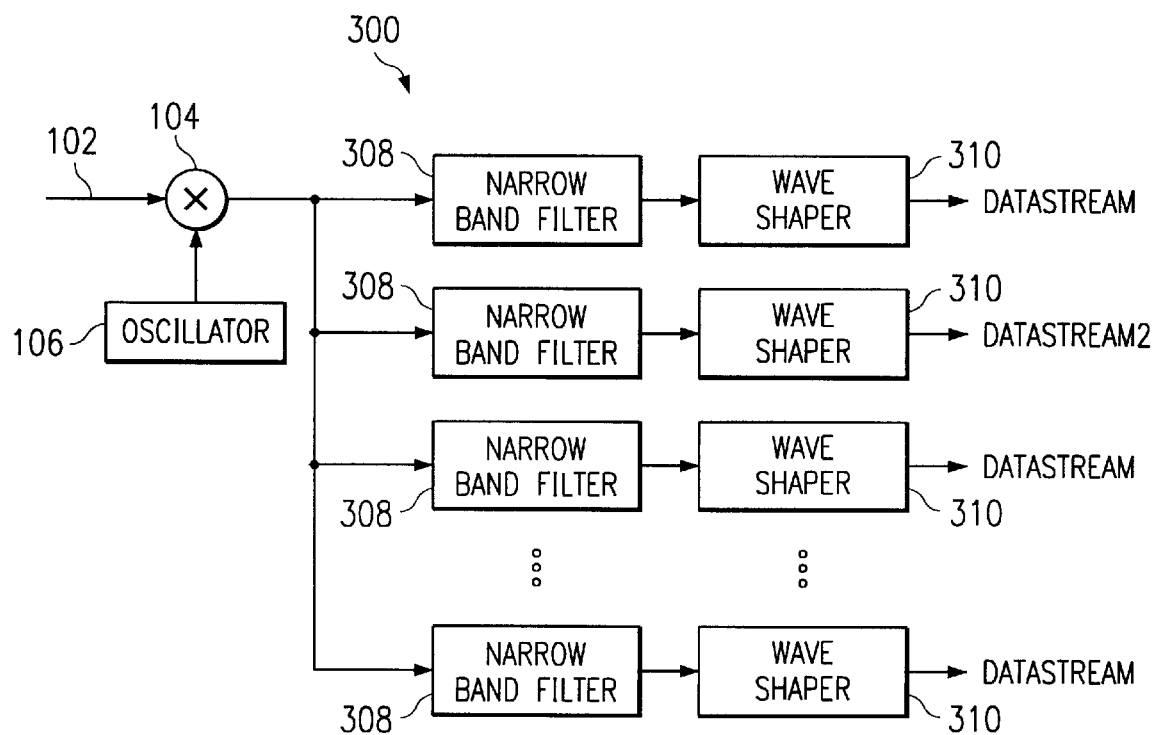
FIG. 5 is an alternative embodiment of the decoder of FIG. 3 for recovering multiple data signals encoded as a single analog signal.

FIG. 5 illustrates an alternative embodiment of the decoder 100 of FIG. 3, designated by a reference numeral 300. In particular, the decoder 300 is similar to the decoder 100 in all respects except that it comprises a plurality of filters 308 and wave shapers 310 to enable the simultaneous recovery of multiple digital data streams. In other words, the decoder 300 decodes several "channels" of data simultaneously. As previously indicated, the encoded analog signal transmitted via the transmission medium 102 may include several encoded data streams each encoded using a different length, and hence a different frequency, pulse to represent transitions in the data stream. Accordingly, in the embodiment illustrated in FIG. 5, each of the filters 308 is tuned to a different frequency, and hence the output thereof will be a series of pulses representing a different data stream. As with the embodiment shown in FIG. 3, the output of each filter 308 is input to a corresponding wave shaper 310, which reconstructs the data stream as described above.

Although an illustrative embodiment of the invention has been shown and described, other modifications, changes, and substitutions are intended in the foregoing disclosure. Accordingly, it is appropriate that the appended claims be construed broadly and in a manner consistent with the scope of the invention.

What is claimed is:

1. A method of processing an analog signal comprising a plurality of digital data streams, each one of said plurality of digital data streams encoded as a series of pulses of a corresponding one of a plurality of lengths, the method comprising:

mixing said analog signal with a local oscillator signal;

passing said analog signal mixed with said local oscillator signal through a filter tuned to a first frequency by said step of mixing said analog signal with said local oscillator signal, said first frequency corresponding to a selected one of said plurality of lengths, to recover said series of pulses corresponding to said selected one of said plurality of lengths;

detecting a polarity of each of said pulses;

using said detected polarities to reconstruct said digital data stream encoded as said series of pulses corresponding to said selected one of said plurality of lengths.

2. The method of claim 1 wherein a frequency of said local oscillator signal is significantly higher than said first frequency.

3. The method of claim 2 wherein said local oscillator signal frequency is 1 GHz.

4. Apparatus for processing an analog signal transmitted via a transmission medium, said analog signal comprising a plurality of digital data streams, each one of said plurality of digital data streams encoded as a series of pulses of a corresponding one of a plurality of lengths, the apparatus comprising:

means for filtering said analog signal to recover, from said plurality of series of pulses, said series of pulses corresponding to a selected one of said plurality of lengths;

means for detecting a polarity of each of said pulses and reconstructing said digital data stream encoded as said series of pulses corresponding to said selected one of said plurality of lengths using said detected polarities.

5. The apparatus of claim 4 further comprising means for mixing said analog signal with a local oscillator signal prior to said filtering, said mixing means tuning said filtering means to a first frequency corresponding to said selected one of said plurality of lengths.

6. The apparatus of claim 5 wherein a frequency of said local oscillator signal is significantly higher than said first frequency.

7. The apparatus of claim 6 wherein said local oscillator signal frequency is 1 GHZ.

8. The apparatus of claim 4 wherein said means for filtering is a narrow band filter.

9. The apparatus of claim 4 wherein said transmission medium is a wired medium.

10. The apparatus of claim 4 wherein said means for detecting and reconstructing comprises a wave shaper.

11. The apparatus of claim 10 wherein said wave shaper comprises:

a first comparator having a positive tied to ground and a negative input connected to an output of said filtering means;

a second comparator having a negative tied to ground and a positive input connected to an output of said filtering means; and a flip-flop having a first input connected to an output of said first comparator and a second input connected to an output of said second comparator.

12. Apparatus for processing an analog signal transmitted via a transmission medium, said analog signal comprising a plurality of digital data streams, each one of said plurality of digital data streams encoded as a series of pulses of a corresponding one of a plurality of lengths, the apparatus comprising:

a narrow band filter for filtering said analog signal to recover a selected one of said plurality of series of pulses, said narrow band filter tunable to a first frequency corresponding to said length of said selected one of said plurality of series of pulses; and a wave shaper for detecting a polarity of each of said pulses and reconstructing said digital data stream encoded as said selected one of said plurality of series of pulses using said detected polarities.

13. The apparatus of claim 12 further comprising a mixer for mixing said analog signal with a local oscillator signal prior to said filtering.

14. The apparatus of claim 13 wherein a frequency of said local oscillator signal is significantly higher than said first frequency.

15. The apparatus of claim 14 wherein said local oscillator signal frequency is 1 GHZ.

16. The apparatus of claim 12 wherein said transmission medium is a wired medium.

17. The apparatus of claim 12 wherein said wave shaper comprises:

a first comparator having a positive tied to ground and a negative input connected to an output of said narrow band filter;

a second comparator having a negative tied to ground and a positive input connected to an output of said narrow band filter; and a flip-flop having a first input connected to an output of said first comparator and a second input connected to an output of said second comparator.

\* \* \* \* \*